United States Patent
Antley et al.

(10) Patent No.: US 7,418,643 B2
(45) Date of Patent: Aug. 26, 2008

(54) INTEGRATED CIRCUIT HAVING ELECTRICALLY ISOLATABLE TEST CIRCUITRY

(75) Inventors: Richard L. Antley, Richardson, TX (US); Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 176 days.

(21) Appl. No.: 11/530,512

(22) Filed: Sep. 11, 2006

(65) Prior Publication Data

US 2007/0035324 A1  Feb. 15, 2007

Related U.S. Application Data

(62) Division of application No. 10/345,648, filed on Jan. 16, 2003, now Pat. No. 7,124,341.

(60) Provisional application No. 60/349,590, filed on Jan. 18, 2002.

(51) Int. Cl.
*G01R 31/28* (2006.01)
*H01L 23/58* (2006.01)

(52) U.S. Cl. .................. 714/734; 257/48

(58) Field of Classification Search .......... 714/734; 257/48

See application file for complete search history.

(56) References Cited

U.S. PATENT DOCUMENTS

| | | | | |
|---|---|---|---|---|
| 5,578,935 | A | * | 11/1996 | Burns .................. 324/763 |
| 5,592,496 | A | * | 1/1997 | Shimizu et al. ......... 714/740 |
| 5,956,567 | A | * | 9/1999 | Tomita ................. 438/18 |
| 6,549,480 | B2 | * | 4/2003 | Hosogane et al. ........ 365/226 |

OTHER PUBLICATIONS

"High-Speed Measuring System for Testing Mixed-Signal-LSIperformance and its Application to Digital-Noise Measurement" by Tsukada et al. IMTC Conference INSPEC Accession No. 4829534.*

"Critical Parameters for High-Performance Dynamic Response Measurements" by Murray et al. International Test Conference Proceedings Publication Date: Sep. 10-14, 1990, pp. 462-471 INSPEC Accession No. 3976212.*

* cited by examiner

*Primary Examiner*—Cynthia Britt
(74) *Attorney, Agent, or Firm*—Lawrence J. Bassuk; W. James Brady; Frederick J. Telecky, Jr.

(57) ABSTRACT

Special test circuitry in an IC for wafer level testing selectively connects the specialized test circuitry to the functional circuitry during wafer test. Following wafer test the special test circuitry is electrically isolated from the functional circuitry and power supplies such that it does not load functional circuit signals nor consume power.

6 Claims, 2 Drawing Sheets

INTEGRATED CIRCUIT HAVING ELECTRICALLY ISOLATABLE TEST CIRCUITRY

This application is a divisional of prior application Ser. No. 10/345,648, filed Jan. 16, 2003 now U.S. Pat. No. 7,124,341, which claims priority under 35 USC § 119(e)(1) of provisional application No. 60/349,590, filed Jan. 18, 2002.

BACKGROUND OF THE INVENTION

Today ICs are designed to include test circuitry, such as scan and Built In Self Test (BIST), that can be used to test the IC at all levels of assembly and manufacturing, i.e. wafer test, packaged IC test, system integration test, and field test. In order to reuse the test circuitry in such a manner, the test circuitry must be designed as an integral and active part of the IC. Being an integral part of the IC, the test circuitry is connected to the functional circuitry to be tested and also connected to the IC power supply rails.

While this is the way traditional test circuitry is designed into ICs, there are some types of specialized test circuitry included in ICs that only participate in wafer level testing. This specialized test circuitry advantageously allows wafer level testing to be performed using lower cost testers and with higher precision, especially the testing of sensitive analog circuits. Like other scan and BIST test circuitry, this specialized test circuitry is conventionally designed to be connected to the functional circuitry it will test and to the IC's power supplies. However, unlike the scan and BIST circuitry, the specialized test circuitry is only usable at the wafer test level since the die pads required for accessing the specialized test circuitry are typically not bonded out to package pins.

U.S. Pat. No. 5,578,935 teaches a method and apparatus of testing a circuit under test by embedding an integrated strobed comparator test circuit in the IC and connecting an input of the comparator to the output of a circuit under test in the IC. The integrated strobed comparator and circuit under test are also connected to an external tester for power, reference voltage inputs, and test input stimulus and output response signaling. The test arrangement of FIG. 1 of U.S. Pat. No. 5,578,935 allows the tester, the circuit under test and comparator within the IC to interact together according to a described successive approximation algorithm of FIG. 2 to achieve the test. The motivation and advantages for embedding the comparator into the IC are that the embedded comparator minimizes the effect of stray capacitance and inductance on a signal under test.

BRIEF SUMMARY OF THE INVENTION

The present invention describes a method and apparatus using special test circuitry in an IC for wafer level testing but without having to permanently connect the specialized test circuitry to the functional circuitry after wafer test is complete. The advantage brought forth by the present invention is that following wafer test the special test circuitry is electrically isolated from the functional circuitry and power supplies such that it does not load functional circuit signals nor consume power.

The integrated circuit of the present invention provides functional circuitry and test circuitry on the same substrate. The functional circuitry has first input and output signal leads connected to first input and output signal bond pads and first power supply terminals connected to first power bond pads. The functional circuitry is adapted to produce a test response signal at a first output signal bond pad for testing of the functional circuitry in response to a test stimulus signal being applied to a first input signal bond pad.

The test circuitry has second input inputs and output signal leads connected to second input and output signal bond or test pads and second power supply leads connected to second power bond or test pads. The second leads and bond or test pads are separate from the first leads and bond pads. The first leads and bond pads and the second leads and bond or test pads are adapted to be selectively connected together during a test to operate both the functional circuitry and the test circuitry to test the operation of the functional circuitry with the test circuitry. A One second input test signal bond pad is adapted to receive the test response signal from the first output signal bond pad, another second input reference signal bond pad is adapted to receive a test comparison signal, and a the second output bond pad signal lead provides a test pass/fail response signal in response to the test comparison signal and the test response signal being received at the second input output signal bond pads pad.

DETAILED DESCRIPTION OF THE INVENTION

For the purpose of simplifying the description of the present invention, the use of a type of the above-mentioned special circuitry, as described in U.S. Pat. No. 5,578,935, will be used. While this one type of special test circuitry will be used to describe the advantages of the invention, it should be understood that this is only for exemplary purposes and does not limit the scope of the invention and its applicability to other special test circuitry types.

Figure 1:
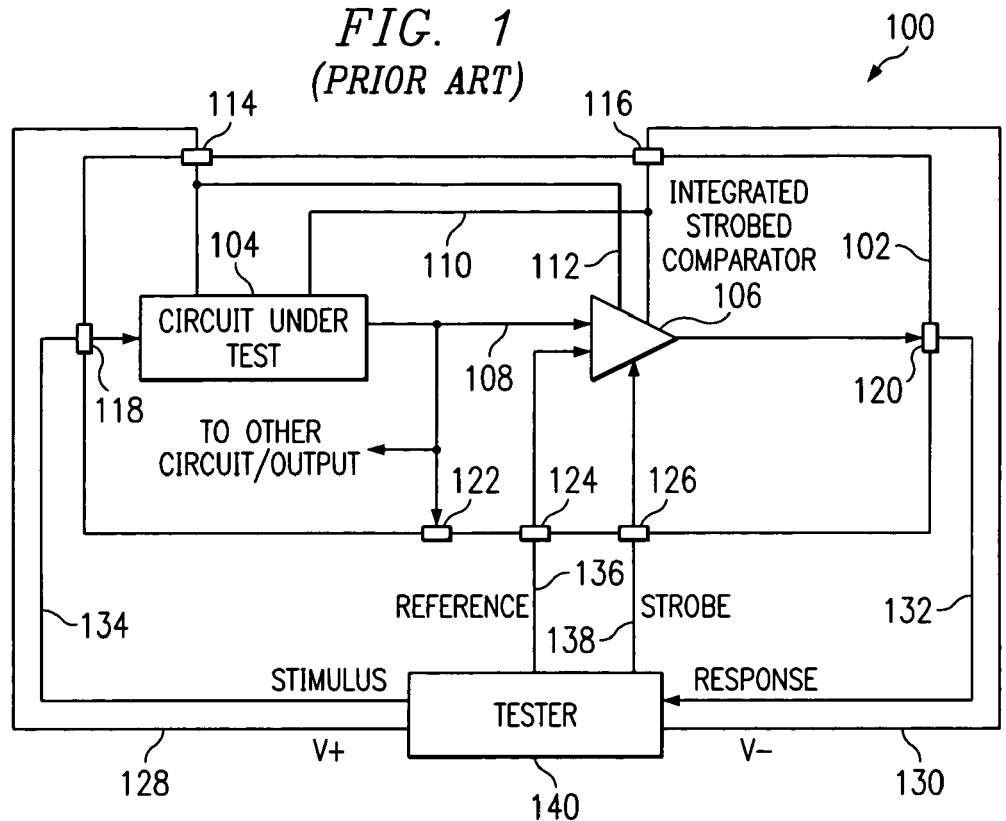
FIG. 1 is a block diagram of a test arrangement connected to a known integrated circuit.

Test arrangement 100 of FIG. 1 of the present invention illustrates a simplified version of the test arrangement of FIG. 1 of U.S. Pat. No. 5,578,935. In present FIG. 1, IC 102 relates to circuit 226 of U.S. Pat. No. 5,578,935, FIG. 1, and includes the circuit under test (CUT) 104 (202 in U.S. Pat. No. 5,578,935) and integrated strobed comparator 106 (206 in U.S. Pat. No. 5,578,935). In present FIG. 1, external tester 140 relates to external tester circuit blocks 200, 208, 220, and 222 of U.S. Pat. No. 5,578,935, FIG. 1. With this relationship established, all further reference to FIG. 1 in this description will be to FIG. 1 of the present specification, unless clearly stated otherwise.

IC 102 of FIG. 1 is assumed to be a die being tested either on wafer or after singulation. IC 102 has a V+ power supply pad 114, a V− power supply pad 116, a test response output pad 120, a comparator strobe input pad 126, a comparator voltage reference input pad 124, a functional output pad 122, and a test stimulus input pad 118. All the pads, except for the functional output pad 122 in this example, are connected to the tester 140 to allow the tester to power up and test circuit 102. As can be seen, the CUT 104 and comparator 106 of circuit 102 are both powered by the V+ and V− power supply pads 114,116, via internal power bussing rails 112 and 110 respectively.

The output 108 from CUT 104 is connected to a first input of the comparator 106, to the functional output pad 122, and perhaps to other circuits within IC 102. The second input of comparator 106 is connected to the voltage reference output 136 from tester 140. The strobe input of comparator 106 is connected to a strobe output 138 from the tester 140. In response to the strobe input 138 from tester 140, the comparator outputs response to the tester's response input 132. The CUT 104 receives stimulus input from the tester's stimulus output 134.

During test, the tester 140 inputs a repetitive stimulus input 134 to CUT 104 to cause the CUT 104 to output 108 a periodic waveform to comparator 106. Comparator 106, when strobed, outputs a digitized response to tester's response input 132. In one aspect of the test, as described further in U.S. Pat. No. 5,578,935, the test proceeds based on a successive approximation algorithm whereby the tester increases the voltage reference level 136 to comparator 106 if the strobed response input 132 is a logic zero and decreases the voltage reference level 136 to comparator 106 if the strobed response input 132 is a logic one. The IC 102 passes or fails the test based on the digitized response input 132 received by the tester 140.

In IC 102, the comparator 106 is permanently connected to the power supplies 114 and 116 pads that are also connected to the CUT 104. This is important. Whenever the CUT 104 is energized, the comparator 106 is also energized. Comparator 106 therefore consumes power during functional operation of CUT 104 and may, due to a defect in the comparator circuit, actually render IC 102 non-functional or functional but at a reduced or degraded level.

The comparator 106 is permanently connected to the output of the CUT 104. This is also important. Comparator 106 therefore provides some amount of loading to the output of CUT 104, which may increase power consumption of circuit 102 and/or effect the quality of the CUT output 108 at functional pad 122. As will be described in detail below, the present invention provides solutions to the above mentioned power and loading concerns when special circuitry (comparator 106) is connected to functional circuitry (CUT 104) and power supply rails (112 and 110) of an IC 102 during its test.

Figure 2:
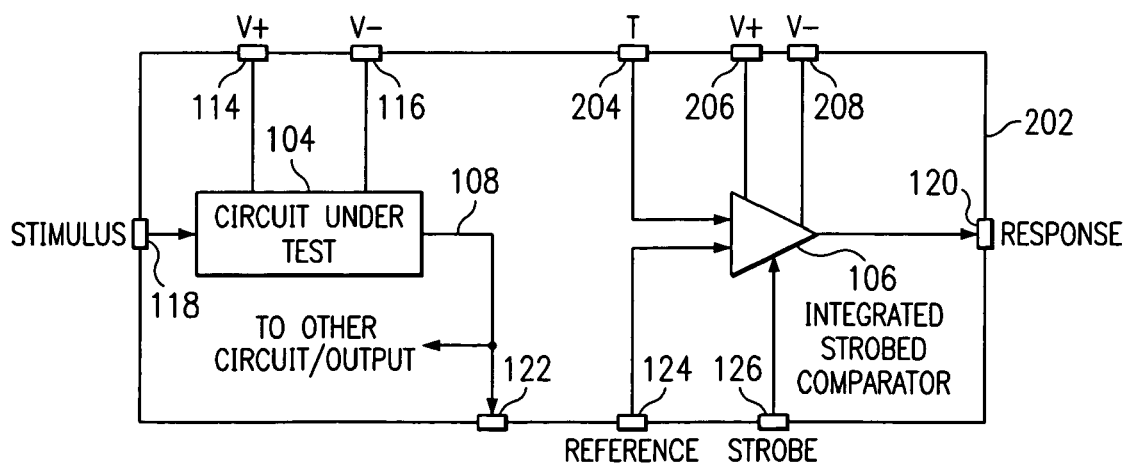
FIG. 2 is a block diagram of an integrated circuit constructed according to the present invention.

In FIG. 2, an IC 202 incorporates the improvements of the present invention. IC 202 is identical to IC 102 with the following exceptions. (1) The permanent connection shown in FIG. 1 between the CUT 104 output 108 and the first input of comparator 106 has been removed, thus isolating the CUT output from the comparator 106 first input load. (2) The first input to comparator 106 has been connected to a separate and additional test (T) pad 204 on IC 202. (3) The V+ and V− power supply connections of FIG. 1 between comparator 106 and the V+ and V− pads 114,116 have been removed to where only the CUT 104 is connected to and powered by the V+ and V− power pads 114,116. (4) The V+ and V− power supplies for comparator 106 have been connected to separate and additional V+ and V− test power supply pads 206,208.

Figure 3:
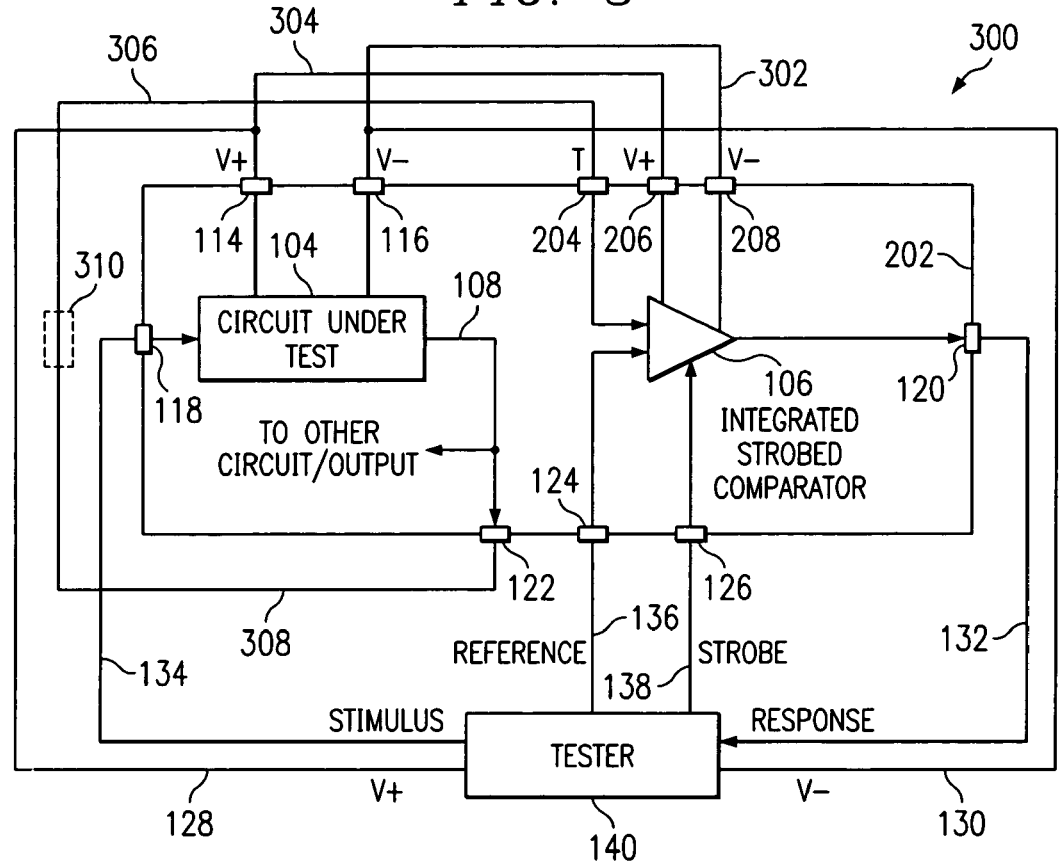
FIG. 3 is a block diagram of a test arrangement according to the present invention.

In FIG. 3, a modified version of the test arrangement 300 depicts IC 202 configured for testing. Test arrangement 300 is identical to the test arrangement 100 with the following exceptions. (1) An external connection 302 has been formed between the existing V− pad 116 and the added V− pad 208 to provide the low-level supply voltage to comparator 106 from tester 140. (2) An external connection 304 has been formed between the existing V+ pad 114 and the added V+ pad 206 to provide the high-level supply voltage to comparator 106 from tester 140.

An external connection comprising connection 308, signal conditioner 310, and connection 306 has been formed between the functional output pad 122 and the added test (T) pad 204. The signal conditioner 310 is an active or passive circuit that can be used, if necessary, for matching the output impedance of functional output pad 122 to the input impedance of test input pad 204. If it is not necessary to use signal conditioner 310, then a direct connection may be formed between functional output pad 122 and test input pad 204. The test performed in the test arrangement 300 of FIG. 3 can be the same as described in regard to FIG. 1 and further in U.S. Pat. No. 5,578,935, and, in at least one aspect, can be based on a successive approximation algorithm.

The IC 202, when being tested, is provided with external connections that couple comparator 106 to power supplies, tester signaling, and CUT 104, but when not being tested the comparator 106 can be completed isolated from power supplies, tester signals, and CUT 104 by simply removing the external connections. Thus the present invention provides for connecting special test circuitry to functional circuitry, power supplies, and testers during test but advantageously also provides for completely isolating special test circuitry from functional circuitry, power supplies, and testers when testing is not being performed.

After IC 202 is tested, such as after the test bond pads 120, 124, 126, 204, 206 and 208 are not wire bond connected to leads on the IC lead frame and IC 202 is encapsulated, connections 302, 304, 306, 308, and signal conditioner 310 can be removed and prevented from contacting IC 202, leaving pads 204, 206, 208 free to contact other pads or the lead frame leads. The special test circuitry therefore exists within IC 202 to be advantageously used at a targeted test level (i.e. wafer test) but after being used is rendered separate and isolated and can be made inaccessible, such as by covering the test bond pads 120, 124, 126, 204, 206, and 208 with encapsulation material, so as to avoid the concerns over power and loading as previously stated.

While the special test circuitry has been described herein as being a comparator for use in testing an analog signal output from a circuit under test, it should be understood that the special test circuitry could be any type of test circuitry (digital or analog) that is similarly used to test other circuits under test (digital or analog). Other types of special test circuitry will, when not being tested, not be connected to power supplies, other circuit pads, to testers, or to circuits under test.

What is claimed is:

1. A process of testing an integrated circuit comprising:
   A. forming a substrate of semiconductor material;
   B. forming functional circuitry on the substrate, the functional circuitry having a stimulus input bond pad, a functional output bond pad, a first positive power supply bond pad, and a first negative power supply bond pad;
   C. forming test circuitry on the substrate, the test circuitry having a reference input test pad, a test input test pad, a response output test pad, a strobe input test pad, a second positive power supply test pad separate from the first positive power supply bond pad, a second negative power supply test pad separate from the first negative power supply bond pad, and a comparator having inputs connected to the test and reference input test pads, power leads connected to the second positive and second negative power supply test pads, a strobe input connected to the strobe input test pad, and an output connected to the response output test pad; and
   D. connecting the functional output bond pad to the test input test pad and the first power supply bond pads to the second power supply test pads external of the substrate only during testing of the functional circuitry.

2. The process of claim 1 including disconnecting the functional output bond pad from the test input test pad during operation of the functional circuitry.

3. The process of claim 1 including disconnecting the second positive power test pad during operation of the functional circuitry.

4. The process of claim 1 including disconnecting the second negative power test pad during operation of the functional circuitry.

5. The process of claim 1 including forming the comparator to be an analog comparator.

6. The process of claim 1 including forming the comparator to be a digital comparator.

* * * * *